(12) United States Patent
Dixit et al.

(10) Patent No.: US 11,761,987 B2
(45) Date of Patent: Sep. 19, 2023

(54) SYSTEM AND METHOD OF IMPROVING LINEARITY OF CURRENT SENSOR FOR A CIRCUIT INTERRUPTER

(71) Applicant: EATON INTELLIGENT POWER LIMITED, Dublin (IE)

(72) Inventors: Rishabh Dixit, Pune (IN); Theodore James Miller, McDonald, PA (US); Asish Das, Kendrapara (IN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 17/525,547

(22) Filed: Nov. 12, 2021

(65) Prior Publication Data
US 2023/0152353 A1    May 18, 2023

(51) Int. Cl.
*G01R 15/18*     (2006.01)
*G01R 19/165*    (2006.01)
(Continued)

(52) U.S. Cl.
CPC ..... *G01R 15/181* (2013.01); *G01R 19/16571* (2013.01); *H02H 1/0007* (2013.01); *H02H 3/083* (2013.01)

(58) Field of Classification Search
CPC ............ G01R 15/181; G01R 19/16571; H02H 1/0007; H02H 3/083
See application file for complete search history.

(56) References Cited

U.S. PATENT DOCUMENTS 10,365,305 B2   7/2019  Olivier et al.
10,388,445 B2   8/2019  Gao et al.
(Continued)

FOREIGN PATENT DOCUMENTS

DE   102005007971 A1   9/2005
DE   102011002756 A1   7/2012
(Continued)

OTHER PUBLICATIONS

European Patent Office "International Search Report and Written Opinion" for corresponding International PCT Patent Application No. PCT/EP2022/025504, dated Jul. 21, 2023, 18 pp.

*Primary Examiner* — Scott Bauer
(74) *Attorney, Agent, or Firm* — Eckert Seamans Cherin & Mellott, LLC

(57) ABSTRACT

A circuit interrupter includes separable contacts; an operating mechanism; an electronic trip unit; and a current sensor assembly including: a harvester circuit having a primary conductor through which input current passes, a secondary winding and a harvester core structured to saturate at a first input current level, a Rogowski coil structured to measure voltage at an output of the Rogowski coil, the measured voltage indicative of output current of the Rogowski coil, where linearity of the output of Rogowski coil deviates more than a deviation tolerance based at least in part on saturation of the harvester core at the first input current level, and a compensation coil arranged at 180 degree opposite to the secondary winding of the harvester core, the compensation coil structured to delay saturation of the harvester core until the input current reaches a second input current level higher than the first input current level.

20 Claims, 9 Drawing Sheets

(51) Int. Cl.
*H02H 1/00* (2006.01)
*H02H 3/08* (2006.01)

(56) References Cited

U.S. PATENT DOCUMENTS

| | | |
|---|---|---|
| 10,416,195 B2 | 9/2019 | Hurwitz et al. |
| 10,732,206 B2 | 8/2020 | Manikandan et al. |
| 2006/0220774 A1* | 10/2006 | Skendzic ............ G01R 15/181 336/200 |
| 2008/0054898 A1* | 3/2008 | Hausperger .......... G01R 15/185 324/260 |
| 2011/0043190 A1* | 2/2011 | Farr ..................... H01F 27/289 336/84 R |
| 2012/0049839 A1 | 3/2012 | Kiendl |
| 2018/0172767 A1* | 6/2018 | Zhou ....................... H01H 9/54 |

FOREIGN PATENT DOCUMENTS

| | | |
|---|---|---|
| EP | 2998749 A1 | 3/2016 |
| WO | 2007/114566 A1 | 10/2007 |

\* cited by examiner

SYSTEM AND METHOD OF IMPROVING LINEARITY OF CURRENT SENSOR FOR A CIRCUIT INTERRUPTER

FIELD OF THE INVENTION:

The disclosed concept relates generally to circuit interrupters with improved current sensors, and in particular, to circuit interrupters having current sensors with improved linearity.

BACKGROUND OF THE INVENTION:

Circuit interrupters, such as for example and without limitation, circuit breakers, are typically used to protect electrical circuitry from damage due to an overcurrent condition, such as an overload condition, a short circuit, or another fault condition, such as an arc fault or a ground fault. Older circuit breakers used a single current transformer to both sense load current and harvest and supply power to the electrical components that are attached to the current transformers. Newer circuit breakers have separated current sensing function and power harvesting function, and use one sensor (e.g., Rogowski coils) for sensing the load current and another sensor (e.g., a conventional current transformer) for power harvesting. The separation of functions is advantageous in that, it allows using devices that are better suited for performing each function. For example, Rogowski coils, a current transformer having a non-magnetic core (e.g., plastic, epoxy, air, etc., having relative permeability $\mu r=1$), provides more accurate metering than conventional iron-core current transformer does since Rogowski coil are linear as the non-ferromagnetic material cannot saturate at high currents whereas the conventional ferromagnetic-core current transformers saturate at high currents or when a DC component is present in the load current.

In an ideal situation, a perfect linearity is expected of a current sensor—every time the current is doubled, the signal coming out of the current sensor exactly doubles. However, there are a few noise factors, which affect the linearity of the current sensor such as external magnetic field generated by near-by coils and/or near-by pole-to-pole interaction to the external magnetic field. Further, it is also known that inside the circuit interrupters near-by current carrying parts may produce a magnetic field due to the presence of ferromagnetic materials. For example, the presence of the power harvester near or right next to the Rogowski coil and other assemblies on other phases tend to affect the output of Rogowski coils such that the linearity is lost. Further, unwanted interactions among near-by poles (e.g., in 3 pole circuit breakers) generate external magnetic fields that affect the output of Rogowski coils. That is, pole B may affect pole A, pole C may affect pole B, pole A may affect pole B, etc. where the output of each Pole sensor need be affected by respective pole only. Further, the current sensor of a circuit interrupter responds to the localized magnetic field. The magnetic field vector produced by the external magnetic field combines with the sensor field vector to produce a resultant or external magnetic field vector which, without calibration or compensation, is unsuitable for reliable and accurate metering.

There is considerable room for improvement in current sensing in circuit interrupters.

SUMMARY OF THE INVENTION:

These needs, and others, are met by a circuit structured to electrically connect between a power source coupled to a hot conductor and a load. The circuit interrupter includes separable contacts; an operating mechanism coupled to the separable contacts; an electronic trip unit coupled to the operating mechanism; and a current sensor assembly including a harvester circuit comprising a harvester core, a primary conductor through which input current from the power source flows, and a secondary winding wound around a first part of the harvester core, the harvester circuit structured to harvest power from the power source and supply power to at least the operating mechanism and the electronic trip unit, where the harvester core saturates at a first input current level of a range of input current levels; a Rogowski coil comprising a toroid through the center of which the primary conductor passes, the Rogowski coil structured to measure voltage at an output of the Rogowski coil, the measured voltage indicative of output current of Rogowski coil, wherein linearity of the output of Rogowski coil to the input current deviates more than a deviation tolerance based at least in part on saturation of the harvester core at the first input current level, and a compensation coil wound around a second part of the harvester core, the compensation coil structured to delay saturation of the harvester core until the input current reaches a second input current level higher than the first input current level. The electronic trip unit is structured to receive a signal including the measured voltage from the Rogowski coil and cause the operating mechanism to open the separable contacts and interrupt current flowing through the circuit interrupter based at least in part on the measured voltage.

Another example embodiment includes a circuit structured to electrically connect between a power source coupled to a hot conductor and a load. The circuit interrupter includes separable contacts; an operating mechanism coupled to the separable contacts; an electronic trip unit coupled to the operating mechanism; and a current sensor assembly including a harvester circuit comprising a harvester core, a primary conductor through which input current from the power source flows, and a secondary winding wound around a first part of the harvester core, the harvester circuit structured to harvest power from the power source and supply power to at least the operating mechanism and the electronic trip unit, where the harvester core saturates at a first input current level of a range of input current levels; a Rogowski coil comprising a toroid through the center of which the primary conductor passes, the Rogowski coil structured to measure voltage at an output of the Rogowski coil, the measured voltage indicative of output current of Rogowski coil, wherein linearity of the output of Rogowski coil to the input current deviates more than a deviation tolerance based at least in part on saturation of the harvester core at the first input current level, and a magnetic shielding made of magnetic material having a high permeability, the magnetic shielding arranged between the Rogowski coil and the harvester circuit and structured to isolate the non-linearity source from the Rogowski coil over the range of input current levels. The electronic trip unit is structured to receive a signal including the measured voltage from the Rogowski coil, and cause the operating mechanism to open the separable contacts and interrupt current flowing through the circuit interrupter based at least in part on the measured voltage.

Yet another example embodiment includes a method of improving linearity of a current sensor and accuracy of a circuit interrupter including a Rogowski coil for sensing load current, a harvester circuit having a ferromagnetic core, a primary conductor, and a secondary winding, and a compensation coil arranged 180 degree opposite to the secondary winding. The method includes passing input current through the primary conductor, where the ferromagnetic core saturates based on input current reaching a first input current level of a range of input current levels, output current of the Rogowski coil being linear to the input current; delaying, by the compensation coil, saturation of the ferromagnetic core until the input current reaches a second input current level; measuring, by the Rogowski coil, voltage at an output of Rogowski coil, the measured voltage indicative of the output current of the Rogowski coil, the output current exhibiting no deviation of linearity of the output of the Rogowski coil greater than a deviation tolerance over the range of input current levels; receiving, by an electronic trip unit of the circuit interrupter, a signal comprising the measured voltage; determining that the signal indicates a detected fault based on the measured voltage; and in response to determining that the signal indicates the detected fault, tripping the circuit interrupter.

BRIEF DESCRIPTION OF THE DRAWINGS:

A full understanding of the invention can be gained from the following description of the preferred embodiments when read in conjunction with the accompanying drawings in which.

Figure 1:
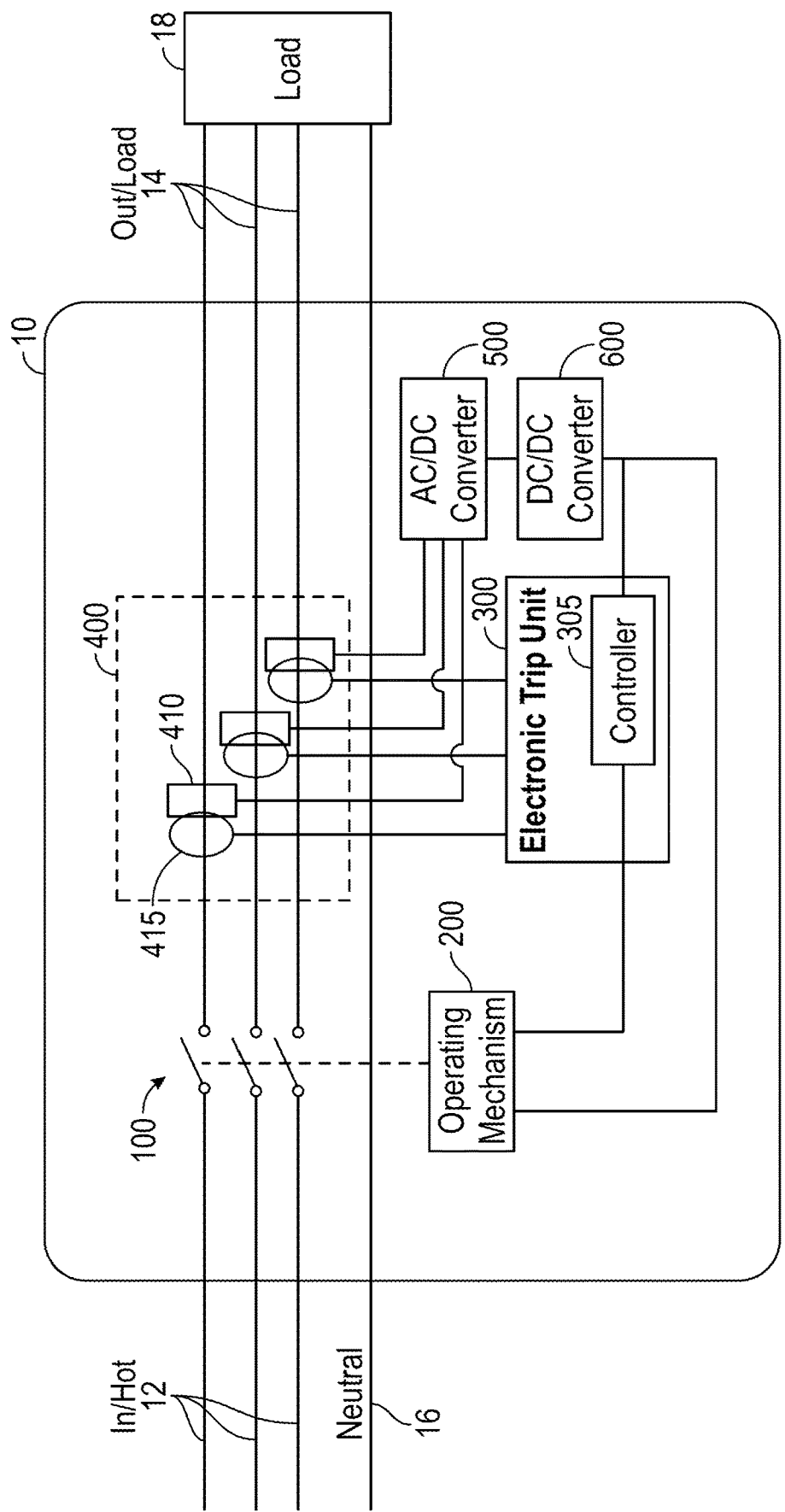
FIG. 1 is a schematic diagram of a circuit interrupter in accordance with an example embodiment of the disclosed concept.

DETAILED DESCRIPTION OF THE INVENTION:

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

Older circuit breakers used conventional iron-core current transformers to both sense load current and harvest power to supply power the electrical components that are attached to the current transformers. As a current measuring device, the current transformer produces a low level current that accurately represents a higher current level for the purpose of metering and protection. It is a closed loop device including a ferromagnetic core, a primary conductor (a primary winding) and secondary winding around the core. The transformer consists of two or more coils wrapped around the ferromagnetic core and connected by the magnetic flux present within the core. The primary winding has a coil with the current to be measured passing through the center of the ferromagnetic core. The coil produces the magnetic field that drives the current on the secondary winding. The current on the secondary winding is proportional to the current flowing through the center of the core. A single current transformer is needed for each phase and/or neutral to monitor current. As a power harvesting device, the current transformer provides AC power, which is rectified and then regulated to a stable DC voltage before being fed to electrical components (e.g., without limitation, an operating mechanism, an electronic trip unit, or a controller of circuit interrupter). The primary winding is connected to the source, and the secondary winding is connected to the electrical components. The core supports both windings and magnetically couples the primary and secondary windings. The performance of the current transformer depends on the amount of the magnetic flux in the core. The current transformer operates in linear region and saturation region. In the linear region, magnetic flux density is approximately proportional to field intensity, but in the saturation region the increase in flux density slows down and eventually becomes constant. Saturation is a state in which the current transformer is no longer able to produce an output proportional to its primary current or according to its ratio. Saturation causes distortion in the secondary voltage and should be avoided or delayed for applications requiring both current sensing and energy harvesting.

Newer circuit breakers use a separate current sensor (e.g., a Rogowski coil) for sensing load current and a harvester circuit (e.g., a conventional iron-cored current transformer) for power harvesting for the electrical components attached thereto in order to achieve more reliable metering and protection. For example, a Rogowski coil may be a better metering mechanism than a conventional current transformer having ferromagnetic core due to the coil linearity— the coil current output to input current relationship is linear for all currents. A typical Rogowski coil is a toroid with a non-magnetic core (e.g., plastic, epoxy, air, etc., having relative permeability $\mu_r=1$). Since non-ferromagnetic material cannot saturate, the output of Rogowski coil is proportional to the sum of time rate of change of the flux within its windings. The presence of the power harvester near or right next to the Rogowski coil and other assemblies on other phases tend to affect the output of Rogowski coil such that the linearity of the output of the Rogowski coil deviates more than a deviation tolerance (e.g., without limitation, less than or equal to 0.25% where 0%=perfect linearity). For example, due to winding and construction imperfections, the output of the Rogowski coil are affected by nearby conductors (e.g., the harvester coils) that carry high currents. Further, unwanted interactions among near-by poles (e.g., in a 3 pole circuit breaker) generate external magnetic fields which affect the output of Rogowski coils. That is, pole B may affect pole A, pole C may affect pole B, pole A may affect pole B, etc. where the output of each pole sensor needs be affected by respective pole only. Thus, linearity of the current sensor may become non-linear beyond the deviation tolerance. The non-linear output of Rogowski coil then reduces the accuracy and reliability of the current sensor and the circuit interrupter. Such non-linearities can be avoided by perfecting the construction and the winding of the Rogowski coil. It is difficult to produce perfect constructed coils. Other approaches can address the non-linearity by reducing the size of the non-linear fields coupled into an imperfect Rogowski coil.

Example embodiments of the disclosed concept address these issues. In some example embodiments, a compensation coil is added to the harvester circuit to improve linearity of the current sensor (e.g., Rogowski coil). Conventionally, a manual calibration is needed to compensate the effect of external magnetic field in sensor linearity performance. One form of calibration involves correcting a minor current deviation without affecting linearity. For example, assume that when 100 A is input, a trip unit (e.g., an electronic trip unit) reads 101 A as the current sensor output and when 200 A is input, the trip unit reads 202 A. While the output is different by a minor amount, the linearity remains intact. That is, the sensor output doubled as the input doubled. In this example, the current sensor is calibrated to calculate one calibration factor to correct the 101 A to 100 A. Another form of calibration involves correction or compensation of non-linearity of the sensor output. Assume that the trip unit reads 101 A when 100 A is input, but the trip unit also reads 205 A when 200 A is input, etc. In this example, the linearity of the current sensor output deviates greater than the deviation tolerance. As such, the Rogowski coil cannot be calibrated to reflect the linearity within the deviation tolerance by simply multiplying the output result by one number at 100 A. Rather, multiple measurements across the range of input current being measured must be performed in order to obtain different calibration factors to correct the non-linearity. Such manual corrections at multiple current levels increase production time and reduce productivity and efficiency.

In order to countermeasure, correct, compensate, countermeasure, mitigate, or preempt the deviation beyond the deviation tolerance and prevent having to obtain multiple calibration factors for calibrating the Rogowski coil exhibiting non-linear relationship, the compensation coil is added to the harvester circuit, arranged at 180 degree opposite to the secondary winding of the harvester circuit. The compensation coil in accordance with the present disclosure is structured to generate magnetic flux in the direction of the ferromagnetic core of the harvester circuit, and thus delays the saturation of the harvester core. Such delay prevents the magnetic linking of the additional magnetic flux generated by the harvester coils to Rogowski coil output until a wider range (e.g., without limitation, 800 A-1000 A) of continuous current is reached. This delay has been shown to improve the linearity of the current sensor. For example, the maximum deviation from linearity reduces significantly when the compensation coil is added (e.g., 0.74% without the compensation coil to 0.15% with the compensation coil, where 0% means a perfect linearity) as shown in Table 1.

In some example embodiments, a magnetic shielding with magnetic material having a high relative permeability is incorporated to improve linearity of the Rogowski coil. Typically, circuit breakers do not include a magnetic shielding between the harvester circuit and the Rogowski coil, thereby allowing the magnetic flux to link the Rogowski coil and return to their source (i.e., the primary winding) via air. Rather, there is only a plastic plate used to assemble both Rogowski coil and harvester coils. Incorporating a magnetic shield made of magnetic material having a high permeability (e.g., without limitation, $\mu r \geq 10,000$) in accordance with the present disclosure effectively isolates a source of non-linearity (e.g., the saturated harvester core, a near-by current carrying components within the circuit interrupter, a near-by pole-to-pole interaction, etc.) from the linear Rogowski coil so as to preserve and/or improve the linearity of Rogowski coils. In some examples, by changing the material of the conventional plastic plate to assemble the Rogowski coils and harvester coils to magnetic steel in accordance with the disclosed concept, this plate may also serve the purpose of magnetic shielding.

Figure 7:
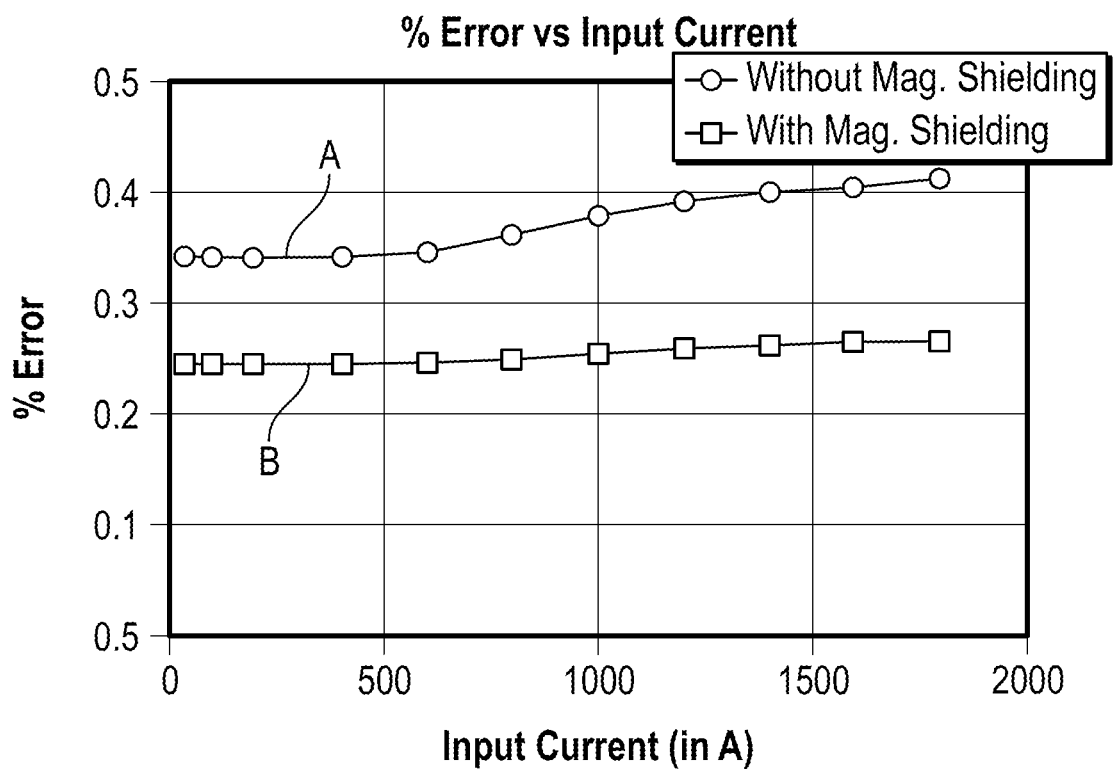
FIG. 7 illustrates error rates of Rogowski coil in accordance with an example embodiment of the disclosed concept.

It is well-known that the higher the permeability of the material the more the magnetic flux pass through the material. Thus, the magnetic shielding with magnetic material having a high permeability creates a low reluctance return path for magnetic flux of external magnetic fields generated by the source of non-linearity. As such, the magnetic shielding absorbs the external magnetic fields as the magnetic field lines travel through the magnetic material of the magnetic shield in the return path to the source of the non-linearity, never finding it more efficient to permeate the air space around the magnetic shield. Thus, shielding either the source of the non-linearity (e.g., the saturated harvester core, a near-by current carrying components within the circuit interrupter, a near-by pole-to-pole interaction, etc.) or the component to be protected (e.g., the Rogowski coil) not only improves significantly the linearity of the current sensor and the accuracy of the circuit interrupter, but also offers the most effective use of the magnetic shielding material and the most cost efficient way of improving linearity of the Rogowski coils. For example, a percentage error measured over a range of input current levels ranging from 30 A to 1800 A without the magnetic shield present has been shown to range from .34 to .41% with a bending observed between 400 A to 1200 A input current levels whereas a percentage error measured over the same range of input current levels with the full magnetic shield with the material having high permeability has been shown to remain constant at around .23% as illustrated in FIG. 7. That is, the Rogowski coil output exhibits an improved linearity with the magnetic shielding (i.e., no bending observed).

Therefore, the example embodiments of the disclosed concepts improve the linearity of the output of the Rogowski coil and the accuracy of the circuit interrupter by incorporating a compensation coil structured to delay saturation of the harvester core or a magnetic shield structured to isolate the non-linearity source from the linear Rogowski coil. Such simple addition of the compensation coil or the magnetic shielding (e.g., a magnetic plate) that are commonly available results in signification production increases at a minimum construction cost and satisfies the customer demand for high accuracy and reliability of current sensors and circuit interrupters for metering and protection.

FIG. 1 is a schematic diagram of a circuit interrupter 10 (e.g., without limitation, a circuit breaker) in accordance with an example embodiment of the disclosed concept. The circuit interrupter 10 is structured to be electrically connected between a power source (now shown) via HOT conductors 12 and a load(s) 18 via LOAD conductors 14. The circuit interrupter 10 is structured to trip open or switch open to interrupt current flowing to the load 18, for example, in the case of a fault condition (e.g., without limitation, an overcurrent condition) to protect the load 18, circuitry associated with the load 18, as well as the components within the circuit interrupter 10. While a 3-phase circuit breaker 10 is shown in FIG. 1, it will be appreciated that a single phase circuit breaker or any other number of phases may be employed without departing from the scope of the disclosed concept.

The circuit interrupter 10 includes separable contacts 100, an operating mechanism 200, an electronic trip unit 300, a current sensor assembly 400, an AC/DC converter 500 and DC/DC converter 600. The operating mechanism 200 is structured to physically open and close the separable contacts 100. The electronic trip unit 300 is structured to control the operating mechanism 200 to open the separable contacts 100 based on a signal including voltage measured at an output of the Rogowski coil 515. The electronic trip unit 300 includes a controller 305 structured to monitor for faults based on power flowing through the circuit breaker 10 and output a trip signal to the operating mechanism 200. For example, in a mechanical circuit interrupter, the separable contacts are designed to interrupt current flowing through the circuit interrupter and have associated components such as an arc chute to manage arcing as a result of circuit interruption. In some example embodiments, the separable contacts 100 are closed with manual intervention by a user through, for example, a reset switch. In some example embodiments, the operating mechanism 200 is structured to close the separable contacts 100 in response to a close signal from the electronic trip unit 300. The controller may be further structured to control the operation of the current sensor assembly 400 (e.g., the harvester circuit).

The current sensor assembly 400 includes a harvester circuit 410 and a current sensor 415. In some example embodiments, the harvester circuit 410 includes a compensation coil 425 arranged 180 degree opposite to the harvester coils as described with reference to FIGS. 2-4B. The harvester circuit 410 may be, e.g., without limitation, an iron-cored current transformer capable of harvesting and powering the electric devices (e.g., the operating mechanism 200, the electronic trip unit 300 via the controller 305, or a controller (not shown) of the circuit interrupter 10) attached to the harvester circuit 410. Upon passing input current through a primary conductor of the harvester circuit 410, the harvester circuit 410 is structured to supply power to the electronic devices after the reduced AC current from secondary winding is rectified by the AC/DC converter 500, regulated to a stable low DC voltage by the DC/DC converter 600, and filtered by a filter (not shown). The harvester coil is discussed further in detail with reference to FIG. 2.

The current sensor 415 may be a Rogowski coil helically wrapped around a non-ferromagnetic core and structured to measure voltage at an output and transmit a signal to an electronic trip unit 300, the measured voltage indicative of output current of the Rogowski coil 415. The Rogowski coil 415 is discussed further in detail with reference to FIG. 2.

The electric trip unit 400 is structured to receive a signal including the measured voltage from the Rogowski coil 415. Based on the signal, the electric trip unit 400 determines whether the measured voltage indicates a detected fault and in response to determining the measured voltage indicates the detected fault, trips the circuit interrupter 10 by causing the operating mechanism 200 to open the separable contacts 100. As such, the accuracy and reliability depend on an accurate metering of the output current of Rogowski coil 415, which in turn depends on preserving linearity of the output current of Rogowski coil to the input current at least within a deviation tolerance (e.g., up to 0.25% where 0%=perfect linearity).

However, there are noise factors that affect linearity of Rogowski coil 415, thereby decreasing the accuracy of the circuit interrupter 10. For example, the near-by ferromagnetic core of the harvester circuit 410 or near-by current carrying components (e.g., without limitation, an AC/DC converter 500, a DC/DC converter 600, etc.) generate external magnetic field that negatively affect the linearity of Rogowski coil 415. The ferromagnetic core of the harvester circuit 410 typically saturates about from 200 A to 300 A, thereby generating the external magnetic field upon saturation. In other examples, a near-by pole-to-pole interaction may affect the output current of Rogowski coil (e.g., without limitation, pole A affecting pole B, thereby affecting the output current at pole B), thereby affecting the linearity of the Rogowski coil 415. In order to mitigate or countermeasure these notice factors, the compensation coil 425 is incorporated at a part of the harvester circuit and arranged at 180 degree opposite to the harvester coil (e.g., the secondary winding of the harvester circuit 410). The compensation coil 425 is structured to delay saturation of the ferromagnetic core of the harvester circuit 410, thereby preventing linking magnetic flux of the external magnetic fields generated at least by the saturation of the ferromagnetic core of the harvester circuit 410 until a wider range (e.g., without limitation, 800 A-1000 A) of continuous current. As such, the compensation coil 425 improves the linearity of Rogowski coil 415 and accuracy of the circuit interrupter 10 as discussed further with reference to FIGS. 2-4B.

In some example embodiments, the current sensor 400 includes a harvester circuit 410, a current sensor 415, and a magnetic shielding (e.g., a magnetic shielding 450 of FIG. 5) arranged between the current sensor 415 and the harvester circuit 410. In these example embodiments, the harvester circuit 410 may not include the compensation coil 425. The magnetic shielding 450 is made of a magnetic material (e.g., without limitation, a magnetic plate) with high relative permeability as described with reference to FIGS. 5A-8B. The magnetic shielding 450 is structured to isolate a source of non-linearity (e.g., without limitation, the saturated core of the harvester circuit 410, a near-by current carrying components, a near-by pole-to-pole interaction, etc.) from the Rogowski coil 410. The magnetic shielding 450 isolates the source of non-linearity by generating a return path for magnetic flux of the external magnetic field generated by the source, and accommodating magnetic flux lines of the external magnetic field to travel through the magnetic material of the magnetic shielding to the source via the return path. As such, the magnetic shielding 450 isolates the source of non-linearity from the Rogowski coil 415, effectively shielding the source of the external magnetic field, and thus, improving the linearity of the Rogowski coil output and accuracy of the circuit interrupter 10 as described in further with reference to FIGS. 5-8B.

Figure 2:
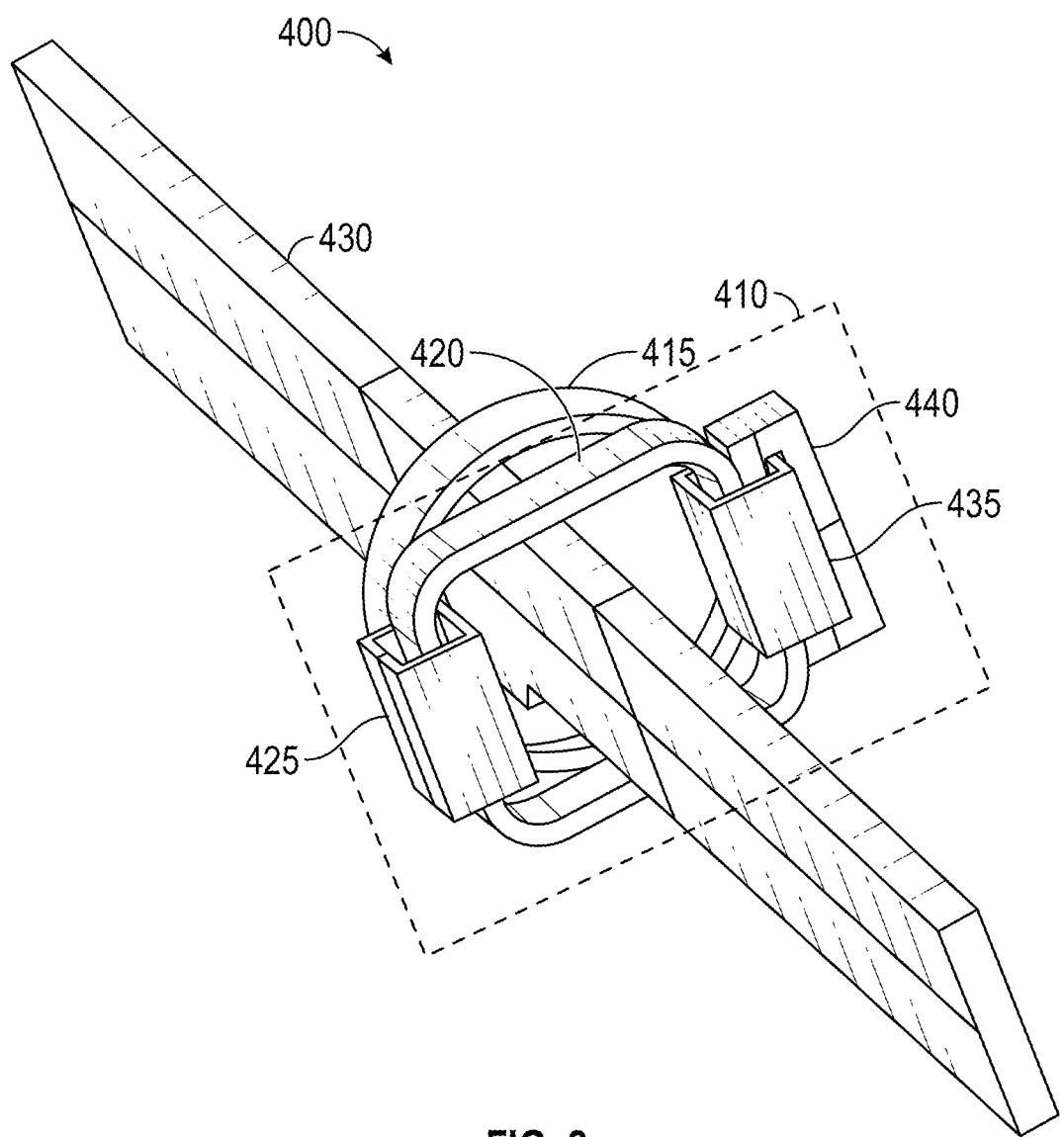
FIGS. 2 illustrates a current sensor assembly of a circuit interrupter in accordance with an example embodiment of the disclosed concept.

FIG. 2 illustrates a current sensor assembly 400 in accordance with an example embodiment of the disclosed concept. The current sensor assembly 400 includes a harvester circuit 410, a current sensor 415, and a compensation coil 425.

The harvester circuit 410 is a current transformer including a harvester core 420, a primary conductor 430 passing through the center of the harvester core 420, a secondary winding 435 wound around a first part of the harvester core 420, and a magnetic burden 440. The harvester circuit 410 is structured to harvest power from the power source and supply power to electric devices coupled to the harvester circuit 410. A single current transformer is needed for each phase and/or neutral to monitor current. The harvester core 420 is a ferromagnetic core. While in FIG. 2 the harvester core 420 is shaped rectangular, it may be circular in some example embodiments. The primary conductor 430 has the current to be measured passing through.

The primary conductor 430 is connected to the HOT conductors 12 for receiving AC power, and the secondary winding 435 is connected to the electric devices (e.g., without limitation, the operating mechanism 200, the electronic trip unit 300, or a stand-alone controller (not shown) of the circuit interrupter 10) within the circuit interrupter 10. The harvester core 420 supports both primary conductor 430 and secondary winding 435 and magnetically couples the primary conductor 430 and secondary windings 435. The primary conductor 430 produces the magnetic field that drives the current on the secondary winding 435. The current on the secondary winding 435 is proportional to input current flowing through the center of the harvester core 420. The harvester coil 410 is controlled by a controller (e.g., the controller 305 in the electronic trip unit 300, or a standalone microcontroller (not shown)) and is structured to generate AC voltage and current based on the AC power received from the HOT conductors 12. The AC voltage is then rectified to a regulated DC voltage by the AC/DC converter 500, the regulated DC voltage is regulated to a stable DC voltage by a DC/DC converter 600, and the voltage ripple of the regulated DC voltage is removed by a filter (not shown) before being supplied to the electric devices (e.g., without limitation, the operating mechanism 200, the electronic trip unit 300, or a stand-alone controller (not shown) of the circuit interrupter 10).

The performance of the harvester circuit 410 depends on the amount of the magnetic flux in the harvester core 420. The current transformer 415 operates in linear region and saturation region. In the linear region, magnetic flux density is approximately proportional to field intensity, but in the saturation region the increase in flux density slows down and eventually becomes constant. Saturation is a state in which the current transformer is no longer able to produce an output proportional to its primary current or according to its ratio. The harvester core 420 saturates at a first input current level of a range of input current levels upon flowing of input current through the primary conductor 430 from the power source. The first input current level may be, e.g., without limitation, about 200 A. Saturation causes distortion in the secondary voltage and negative effect on the linearity of the output of Rogowski coil 415, and should be delayed for metering.

Rogowski coil 415 includes a toroid of a coil(s) helically wrapped around a non-magnetic core (e.g., plastic, epoxy, air, etc.) having relative permeability μr=1. The Rogowski coil 415 is structured to measure voltage at an output of the Rogowski coil 415, the measured voltage indicative of output current of the Rogowski coil 415, the output current being linear to the input current passing through the primary conductor 430. The linearity of the output of Rogowski coil 415 may deviate more than a deviation tolerance (e.g., without limitation, up to 0.25% where 0%=perfect linearity) based at least in part on saturation of the harvester core 420 at the first input current level (e.g., without limitation, about 200 A). Since non-ferromagnetic core cannot saturate, the Rogowski coil outputs remain substantially linear even at high currents. However, the output of Rogowski coil 415 is subject to noise factors including external magnetic fields generated by a source of non-linearity. For example, presence of the harvester circuit 410 near or right next to the Rogowski coil 415 and other assemblies on other phases tend to affect the output of Rogowski coils such that linearity of the output of Rogowski coil 415 deviates beyond the deviation tolerance. Further, unwanted interactions among near-by poles (e.g., in a 3-pole circuit breaker) affect the linearity of the output of Rogowski coil 415. That is, pole B may affect pole A, pole C may affect pole B, pole A may affect pole B, etc., where the Rogowski coil output of each pole needs be affected by respective pole current only. Thus, the output of the current sensor 415 may become non-linear beyond the deviation tolerance as a result of the external magnetic fields generated by the non-linearity source. The non-linear output of Rogowski coil 415 then reduces the accuracy and reliability of the current sensor 415 and the circuit interrupter 10.

In order to correct, compensation, mitigate, countermeasure or event preempt the effect of these non-linearity components on the linearity of Rogowski coil 415, the compensation coil 425 is added to the harvester circuit 410. The compensation coil 425 may be any coil capable of carrying current. The compensation coil 425 is arranged 180 degree opposite to the harvester coils (e.g., secondary winding 435) and structured to delay saturation of the harvester core 420. By generating the magnetic linking of additional magnetic flux generated by the harvester coils 430, 435 to the Rogowski coil output until a wider range of continuous current (e.g., without limitation, about 800 A to 1000 A) and improve linearity of the circuit interrupter 10. That is, the compensation coil 425 provide fully automatic compensation of any deviation of linearity of Rogowski coil 415 beyond the deviation tolerance by delaying the saturation of the harvester core 420 until a second input current level (e.g., about 200 A) is reached. The fully automatic compensation of deviation of Rogowski coils 415 includes simplifying conventional complex manual calibration of non-linear output of the Rogowski coils.

Typically, the current sensor of a circuit interrupter responds to a localized magnetic field. However, the magnetic field vector produced by the external magnetic field combines with the sensor filed vector to produce a resultant or external magnetic field vector which, without calibration or compensation is unsuitable for reliable and accurate metering. Generally, a manual calibration is needed to compensate or correct the effect of external magnetic field in sensor linearity performance. One form of calibration involves correcting a minor current deviation, which does not include deviation of the linearity of Rogowski coil. For example, assume that when 100 A is input, a trip unit (e.g., an electronic trip unit 300) reads 101 A as the Rogowski coil output and when 200 A is input, the electronic trip unit 300 reads 202 A. While the output are different by a minor amount, the linearity remains intact. That is, the sensor output doubled as the input current doubled. In this example, the manual calibration requires obtaining a calibration factor to correct 101 A to 100A and calibrating Rogowski coil 415 to adjust its output based on the calibration factor. This calibration is simple and requires only one calibration using a single calibration factor. Another form of calibration involves correction or compensation of non-linearity of the sensor output. Assume that the electronic trip unit 300 reads 101 A when 100 A is input, but the trip unit 400 also reads 205 A when 200 A is input, etc. As such, Rogowski coil 415 exhibits a non-linear relationship between the input current and current sensor output. In this example, the linearity cannot be obtained by multiplying the output result by one number at 100 A, rather, multiple measurements across the range of input current being measured must be performed in order to obtain different calibration factors. Such manual calibration requiring multiple measurements performed at multiple current levels to obtain respective calibration factors increase production time and reduce productivity and efficiency. By a simple addition of the compensation coil 425, such complex manual calibration can be avoided.

Figure 3A:
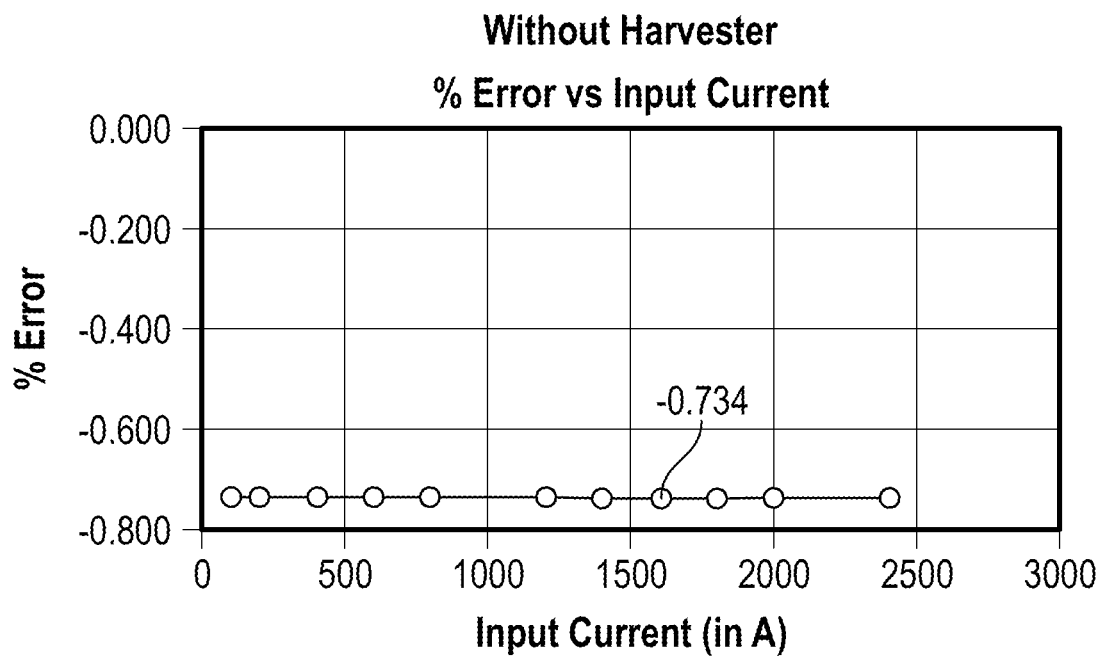
FIGS. 3A-B illustrate graphs of error rates of Rogowski coil in relation to input current in accordance with an example embodiment of the disclosed concept.
Figure 3B:
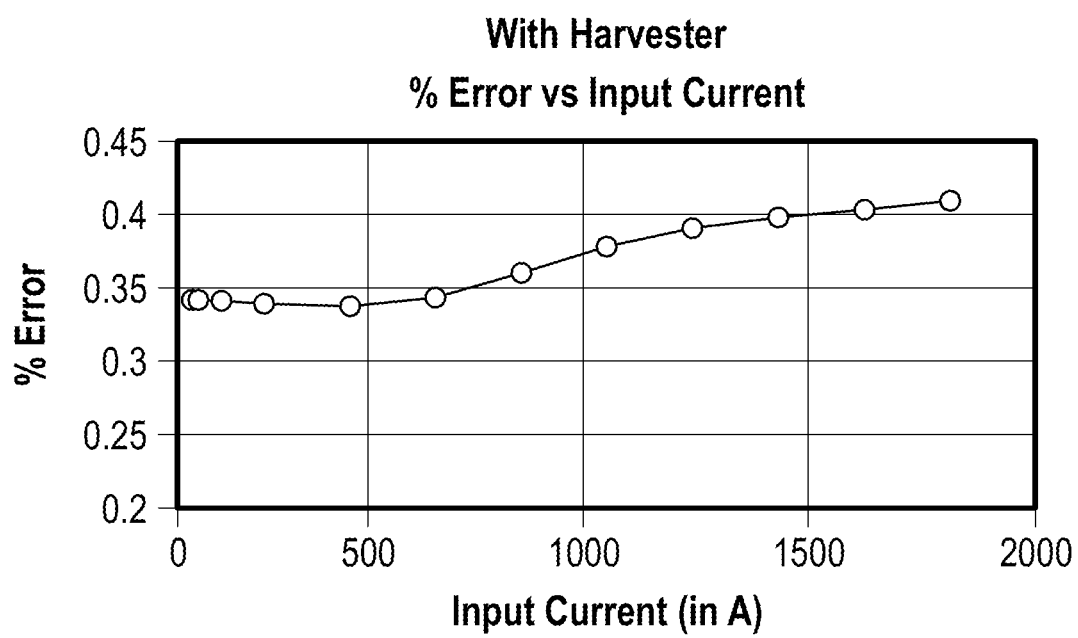

By generating magnetic flux, the compensation coil 425 delays the saturation of the harvester core 420 until higher currents are reached, and prevents the magnetic linking of the additional magnetic flux generated by the harvester coils 430, 435 to the Rogowski coil output until a wider range (e.g., without limitation, 800 A-1000 A) of continuous current is reached. As such, any deviation that would have occurred as a result of the magnetic flux affecting linearity during saturation of the harvester core 420 is automatically avoided, corrected or compensated until the wider range of the current is reached. Such delay of saturation significantly improves the linearity of the output of the Rogowski coil 415. FIGS. 3A-B illustrate graphs of linearity of Rogowski coil 415 in accordance with an example embodiment of the disclosed concept. For FIGS. 3A-B 0% error rate is assumed for the purpose of better illustrating the non-linearity or linearity of Rogowski coil 415. FIG. 3A shows that the linearity of Rogowski coil 415 remains constant as the graph shows no bending. FIG. 3B shows a bending observed over the input current ranging from 400 A to about 1400 A. The bending shows that the presence of the harvester coils 410 significantly affects the linearity of Rogowski coil 415 over the aforementioned input current range. Such bending requires a complex manual calibration measuring multiple calibration factors at different input current. The deviation from linearity, however, can be effectively corrected or compensated by adding the compensation coil 425 as described with reference to FIG. 2. With only the harvester coils 430, 435 present, the harvester core 420 of the harvester circuit 410 saturates early with the input current of 200 A to 300 A. With the harvester coils 435, 435 and the compensation coil 425, the saturation of the harvester core 420 is delayed to the input current ranging from 800 A to 1000 A. Non-linearity can be improved if the saturation of the harvester core 425 is delayed or reduced by the compensation coil 425.

As shown in Table 1 below, maximum deviation from linearity reduces significantly when the compensation coil 425 are added (e.g., 0.74% without the compensation coil to 0.15% with the compensation coil, where 0% means a perfect linearity). Further, as shown in FIG. 4B, an error rate of the Rogowski coil 415 having a two-degree error in winding measured with the compensation coil incorporated exhibits no sudden significant change of the error rate, meaning no deviation of the linearity beyond the deviation tolerance.

TABLE 1

Maximum Deviation from Linearity
with or without Compensation coil

| Case | Maximum Deviation (Perfect Linearity = 0) |
| --- | --- |
| Without the Compensation coil | 0.74 |
| With the Compensation coil | 0.15 |

In some examples, the compensation coil 425 has a higher current than the harvester coils 430, 435 as there is no magnetic burden for the compensation coil 425. As such, the current in the compensation coil 425 can cause power loss (e.g., without limitation, 2-4 Watt), which can be regulated by adding an external resistance (e.g., a resistor) over the compensation coil 425.

Figure 4A:
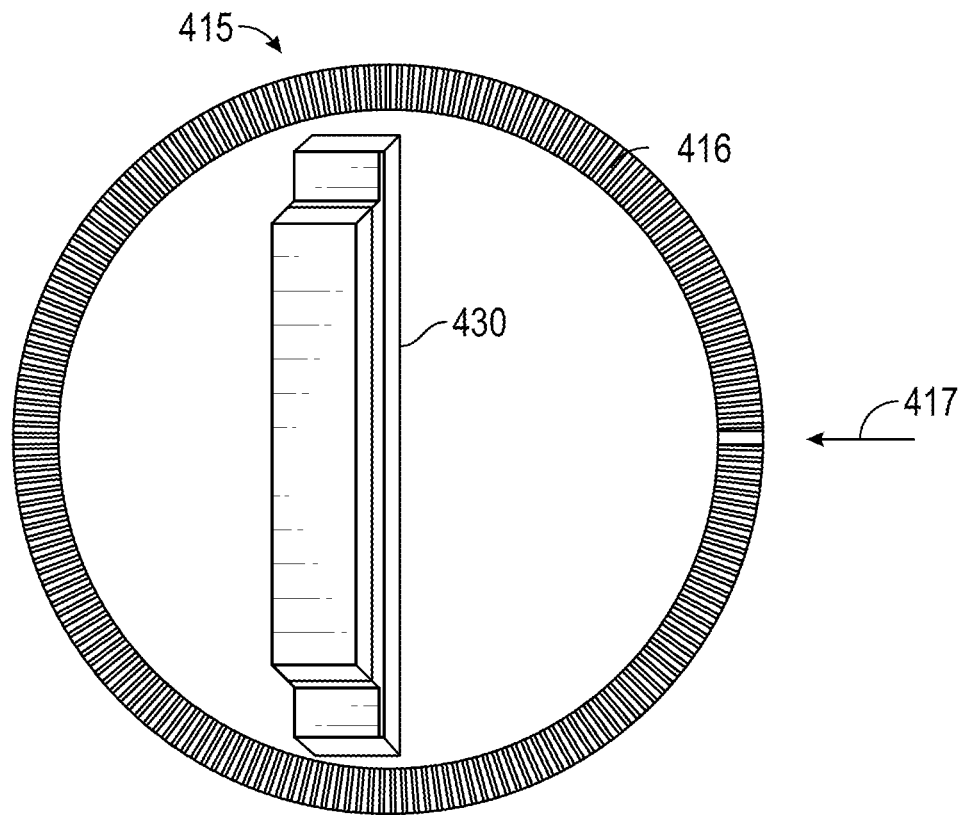
FIGS. 4A-B illustrate 2 degree error in winding of Rogowski coil and error rates of Rogowski coil in relation to input current in accordance with an example embodiment of the disclosed concept.
Figure 4B:
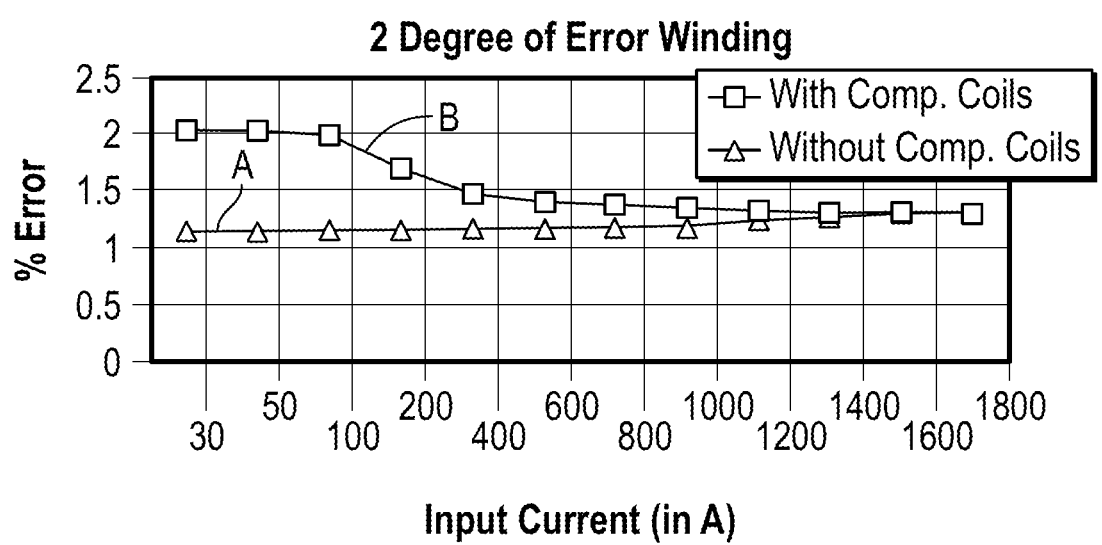

FIGS. 4A-B illustrate error rates of Rogowski coil 415 having two degree of error winding in accordance with an example embodiment of the disclosed concept. A toroidal Rogowski coil is ideally wound with a constant number of turns per centimeter around its perimeter with 20 turns per cm being a typical example. The number of turns per centimeter is referred to as the wire pitch. Deviations from the nominal wire pitch result in the coil being susceptible to pick up from external fields. It is inevitable that in manufacturing the wire pitch will change around the perimeter. One way to characterize a deviation in pitch is to measure what part of the coil's perimeter differs from nominal. For example, a 2 degree error says the pitch has deviated over 2 degrees out of the 360 degrees. The deviation could mean that there are additional turns or missing turns over these two degrees. The coil's susceptibility to external fields depends on both how many degrees of deviation there are and on how much the pitch differs from nominal over this region. One of the purposes of the disclosed concept is to make the Rogowski coil 415 less susceptible to external fields given a certain error in the pitch. FIG. 4A depicts Rogowski coil 415 with Rogowski turns represented as slits 416. There is an error 417 in winding shown on the y-axis. In this example, total of 670 numbers of Rogowski turns were considered and the error spanned two degrees comprising seven turns densely wound or no turns. The error rate B associated with two degree of error winding without the compensation coil 425 ranged from about 2.1 to 1.5% over the input current from 30 A to 1800 A. The error rate A of Rogowski coil 415 with two degree error winding was reduced significantly to about 1.1 to 1.2% when the compensation coil 425 were incorporated to the harvester circuit 410. Further, the linearity of Rogowski coil 415 improves significantly when the compensation coil 425 is added, showing the error rate A remaining constant or substantially constant throughout the input current ranging from 30 A to 1800 A whereas the error rate B shows that there is a significant bending over the input current ranging from 100 A to 600 A when the compensation coil 425 is not incorporated.

Figure 5:
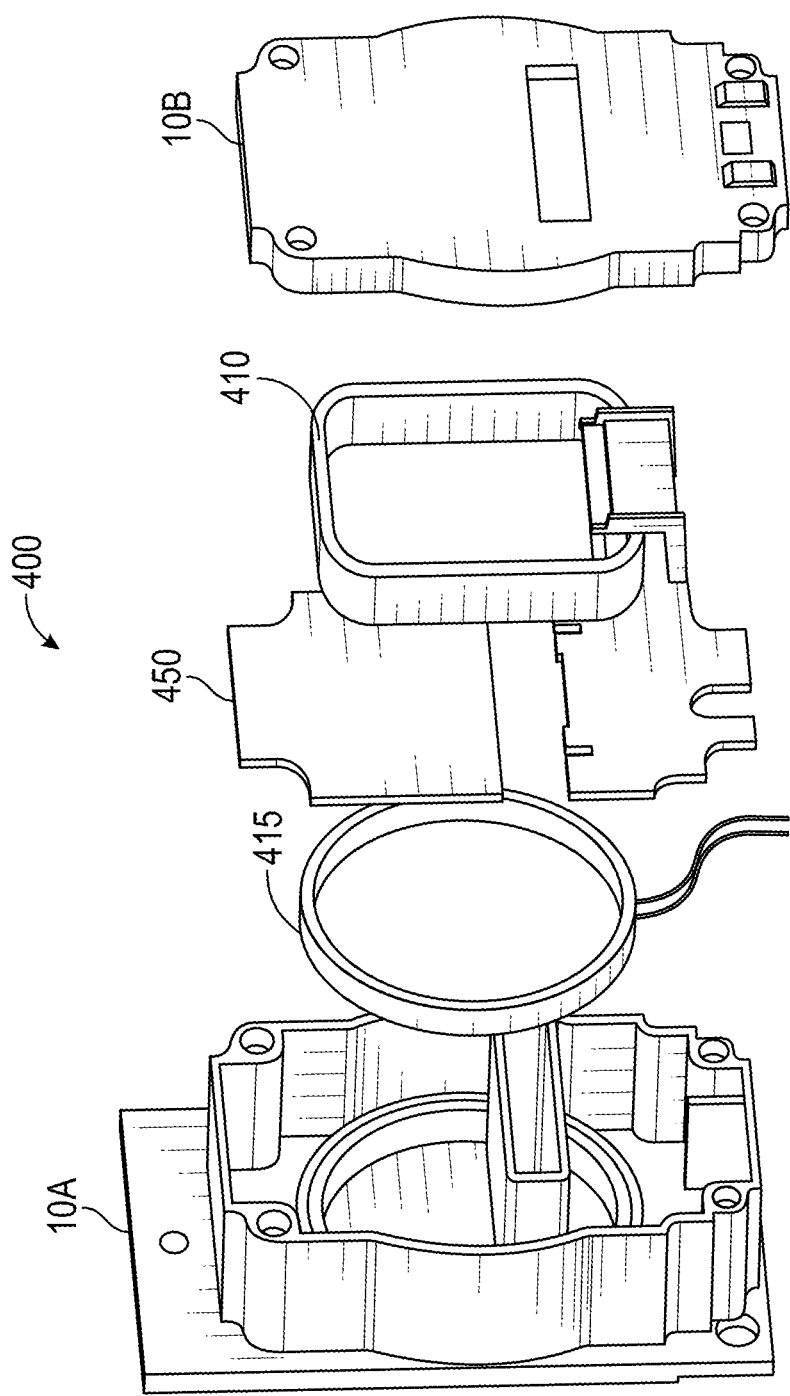
FIG. 5 is an exploded view of a current sensor assembly in accordance with an example embodiment of the disclosed concept.

FIG. 5 is an exploded view of a current sensor assembly 400 in accordance with an example embodiment of the disclosed concept. The current sensor assembly 400 includes a harvester circuit 410, Rogowski coil 415, a magnetic shielding 450, and the housing covers 10A,B. As described with reference to FIGS. 1-2, Rogowski coil 415 are structured to sense the load current by measuring voltage at its output, the measured voltage proportional to the load current input to the primary conductor 430 and indicative of output current at the output of the Rogowski coil 415. The harvester circuit 410 is structured to harvest and power, e.g., without limitation, electric devices (e.g., without limitation, the operating mechanism 200, the electronic trip unit 300, a controller of the electronic trip unit 300, or a standalone controller of the circuit interrupter 10). The magnetic shielding 450 is made of magnetic material, e.g., without limitation, a magnetic plate with high relative permeability. The magnetic plate may be made of mu alloy with relative permeability μr ranging from 80,000 to 100,000. The high permeability includes permeability greater than 10,000. By incorporating the magnetic shielding 450 with the magnetic material having a high relative permeability, the non-linear parts (e.g., without limitation, the harvester circuit 410) are effectively isolated from the linear Rogowski coil 415, thereby preventing the magnetic flux of the external magnetic field generated by, e.g., without limitation, the harvester coils 430, 435 from affecting the output of Rogowski coil 415.

As stated previously, there are noise factors that affect linearity of Rogowski coil 415, thereby decreasing the accuracy of the circuit interrupter 10. For example, the primary conductor 430 of the harvester circuit 410 has the current passing through the center of the core, and the primary conductor 430 produces the magnetic field that drives the current on the secondary winding 435. The harvester core 420 is linear until the magnetic intensity reaches a certain level at which the harvester core becomes saturated. Upon saturation, the harvester core 420 becomes non-linear and the magnetic flux produced by the primary conductor 430 start to affect the linearity of near-by Rogowski coil (e.g., located at about 8 mm distance) 415. Further, near-by current carrying components (e.g., without limitation, an AC/DC converter, a rectifier, etc.) may generate external magnetic field that negatively affect the linearity of Rogowski coil 415. In addition, a near-by pole-to-pole interaction may affect the output current of Rogowski coil (e.g., without limitation, pole A affecting pole B, thereby affecting the output current at pole B), thereby affecting the linearity of the Rogowski coil 415. Typically, circuit breakers either do not include a magnetic shielding between the harvester circuit and Rogowski coil, thereby allowing the magnetic flux to link Rogowski coils. Rather, there is only a plastic plate used to assemble both Rogowski coil and harvester coils. By changing the material of this plastic plate to magnetic steel in accordance with the disclosed concept, this plate may also serve the purpose of magnetic shielding.

Incorporating the magnetic shielding 450 made of magnetic material having a high relative permeability between Rogowski coil 415 and the harvester circuit 410 significantly improves the linearity of Rogowski coil 415. The high permeability allows the magnetic shielding 450 to create a return path with low magnetic reluctance for the magnetic flux of the external magnetic fields generated by a source of non-linearity, e.g., without limitation, the harvester circuit 410, near-by current carrying components, near-by pole-to-pole interaction, etc. As such, the magnetic shielding 450 absorbs the external magnetic fields as the magnetic field lines travel through the material of the magnetic shielding 450 in the return path to the source, never finding it more efficient to permeate the air space around the magnetic shield. Thus, shielding either the non-linearity source (e.g., the harvester circuit) generating the external magnetic field or components (e.g., Rogowski coils) to be protected offers the most effective use of the magnetic shielding material. This magnetic shielding 450 significantly improves the linearity of Rogowski coil 415 as shown in FIG. 7 in which a reduction of the error rate with no bending is observed over the entire range of input current levels from about 30 A to 1800 A.

Figure 6:
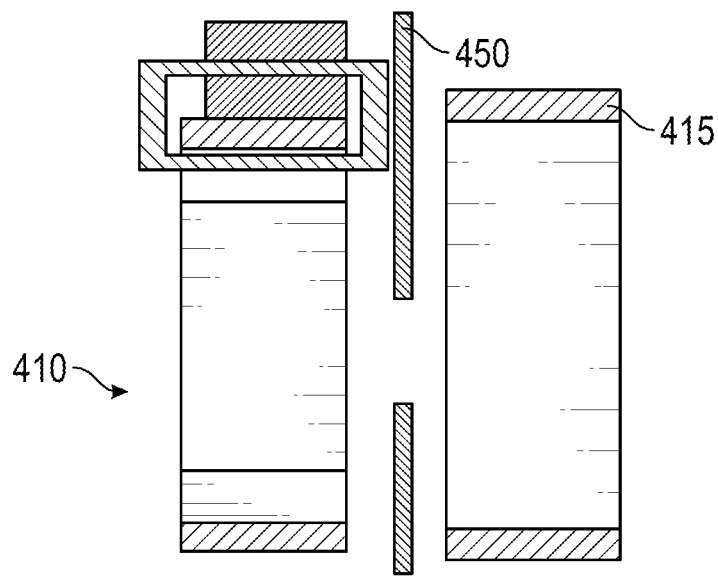
FIG. 6 illustrates a geometrical arrangement of a circuit interrupter including a magnetic shielding in accordance with an example embodiment of the disclosed concept.

FIG. 6 illustrates an example geometric arrangement of a current sensor assembly 400 incorporating a magnetic shielding 450 made of material with high relative permeability in accordance with an example embodiment of the disclosed concept. The magnetic shielding 450 is placed between the harvester circuit 410 and Rogowski coil 415. The distance between the harvester circuit 410 and Rogowski coil 415 is, e.g., without limitation, 8 mm, and the magnetic shielding 450 is placed in between the harvest circuit 415 and Rogowski coil 415 so as to be, e.g., without limitation, equidistant (4 mm) from the harvest circuit 415 and Rogowski coil 415.

FIG. 7 illustrates current sensor error rates in relation to input current in accordance with an example embodiment of the disclosed concept. The percentage error A without the magnetic shielding 450 ranges from .34 to .41% with a bending observed in between 600 A to 1200 A input currents. The percentage error B with the full magnetic shielding 450, however, remains constant at around .23% with no bending observed over the entire range of current from 30 A to 1800 A. This clearly shows that incorporating the magnetic shielding 450 to shield Rogowski coil 415 from the non-linearity source significantly improves the linearity of Rogowski coil 415.

Figure 8A:
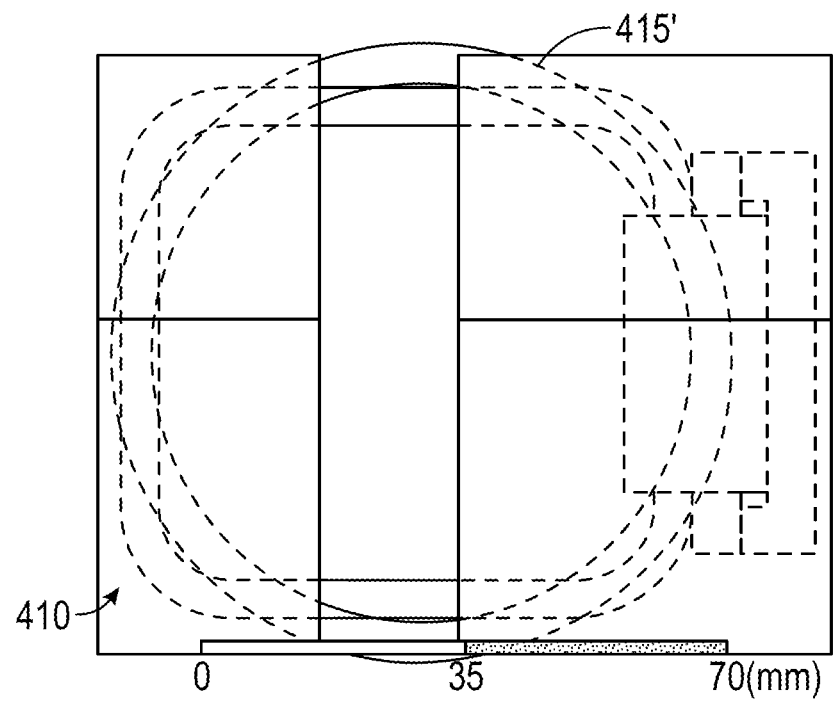
FIGS. 8A-B illustrate Rogowski coil having a non-uniformity of winding and error rates of Rogowski coil in accordance with an example embodiment of the disclosed concept.
Figure 8B:
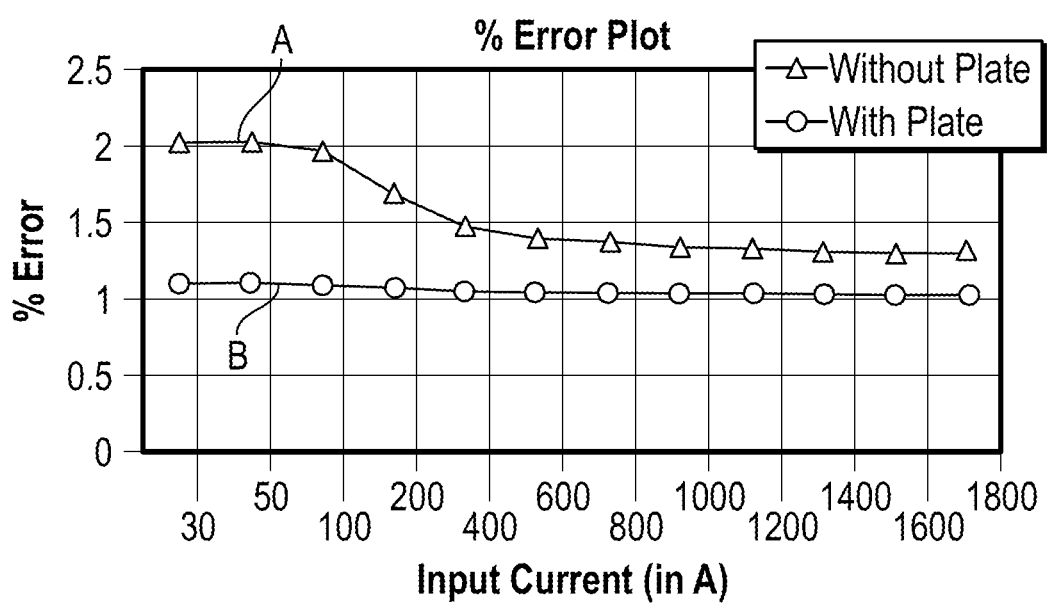

FIGS. 8A-B illustrate current sensor error rates in relation to input current where Rogowski coil 415' have non-uniform winding in accordance with an example embodiment of the disclosed concept. FIG. 8A depicts a current sensor assembly 400 with Rogowski coil with non-uniform winding in accordance with an example embodiment of the disclosed concept. FIG. 8B depicts percentage errors of Rogowski coil 415' with non-uniform winding with or without the magnetic shielding incorporated in accordance with an example embodiment of the disclosed concept. The percentage error A without the magnetic shielding 450 ranges from 1.3 to 2.1% with a bending observed in between 30 A to 600 A input currents. The percentage error B with the full magnetic shielding 450 incorporate, however, remains constant at around 1.1% with no bending observed. Table 2 below shows that maximum deviation (where 0=perfect linearity) is 0.97% without the magnetic shielding 450. Table 2 also shows that the maximum deviation is 0.08 when the magnetic shielding 450 is incorporated. As such, even the linearity of Rogowski coil 415' with non-uniform winding improves significantly with the incorporation of the magnetic shielding 450.

TABLE 2

Maximum Deviation from Linearity of Rogowski coil having Non-uniform Winding with or without Magnetic Shielding

| Case | Maximum Deviation (Perfect Linearity = 0) |
|---|---|
| Without Magnetic Shielding | 0.97 |
| With Magnetic Shielding | 0.08 |

Figure 9:
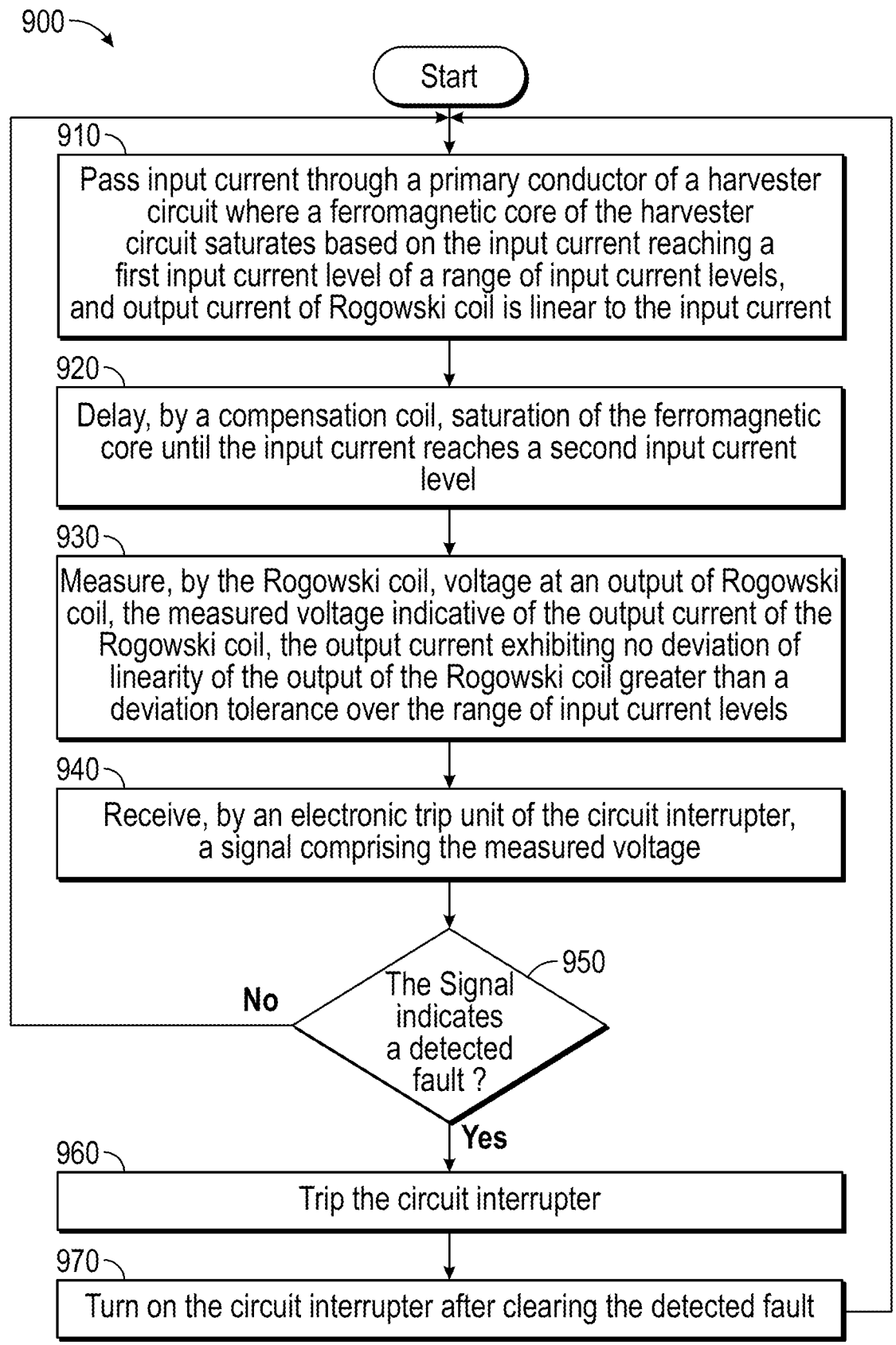
FIG. 9 is a flowchart of a method of improving linearity of current sensors and accuracy of a circuit interrupter in accordance with an example embodiment of the disclosed concept.

FIG. 9 is a flow chart of a method 900 of improving linearity of a current sensor of a circuit interrupter in accordance with an example embodiment of the disclosed concept. The method 900 may be performed by the circuit interrupter 10 as described with reference to FIGS. 1-4B or any components thereof.

At 910, the circuit passes input current through a primary conductor of a harvester circuit, where a ferromagnetic core of the harvester circuit saturates based on the input current reaching a first input current level of a range of input current levels, and output current of Rogowski coil is linear to the input current.

At 920, the compensation coil delays saturation of the ferromagnetic core until the input current reaches a second input current level. Delaying the saturation of the harvester core includes generating magnetic flux in a direction of the harvester core and preventing linking magnetic flux of external magnetic field generated by at least the harvester core to the Rogowski until the second input current level is reached. As such, the compensation coil provides a fully automatic compensation for deviation of linearity. The fully automatic compensation includes an automatic measurement of a single calibration factor for correcting an error in the output of the Rogowski coil based at least in part on the saturation of the harvester core at the second input current level.

At 930, the Rogowski coil measures voltage at an output of Rogowski coil, the measured voltage indicative of the output current of the Rogowski coil, the output current exhibiting no deviation of linearity of the output of the Rogowski coil greater than a deviation tolerance over the range of input current levels. The deviation tolerance may be, e.g., without limitation, 0.25% where 0%=perfect linearity). In some examples, the Rogowski coil includes a plurality of number of turns and two degree error in winding, each turn being represented as a slit and the two degree error in winding including seven slits two degree error in winding, where a first error rate of the Rogowski coil with the compensation coil is lower than a second error rate of the Rogowski coil without the compensation coil, the first error rate exhibits a sudden change in error rate over a first range starting from the first input current level, and the second error rate remains constant over the range of input current levels, the sudden change indicative of the deviation of the linearity greater than the deviation tolerance.

At 940, an electronic trip unit of the circuit interrupter receives a signal comprising the measured voltage.

At 950, the circuit interrupter determines whether the signal indicates a detected default. If yes, the method 900 proceeds to 960, and at 960 the circuit interrupter is tripped, at 970 the user turns on the circuit interrupter after clearing the detected fault and the method 900 returns to 910. If no, the method 900 returns to 910.

Figure 10:
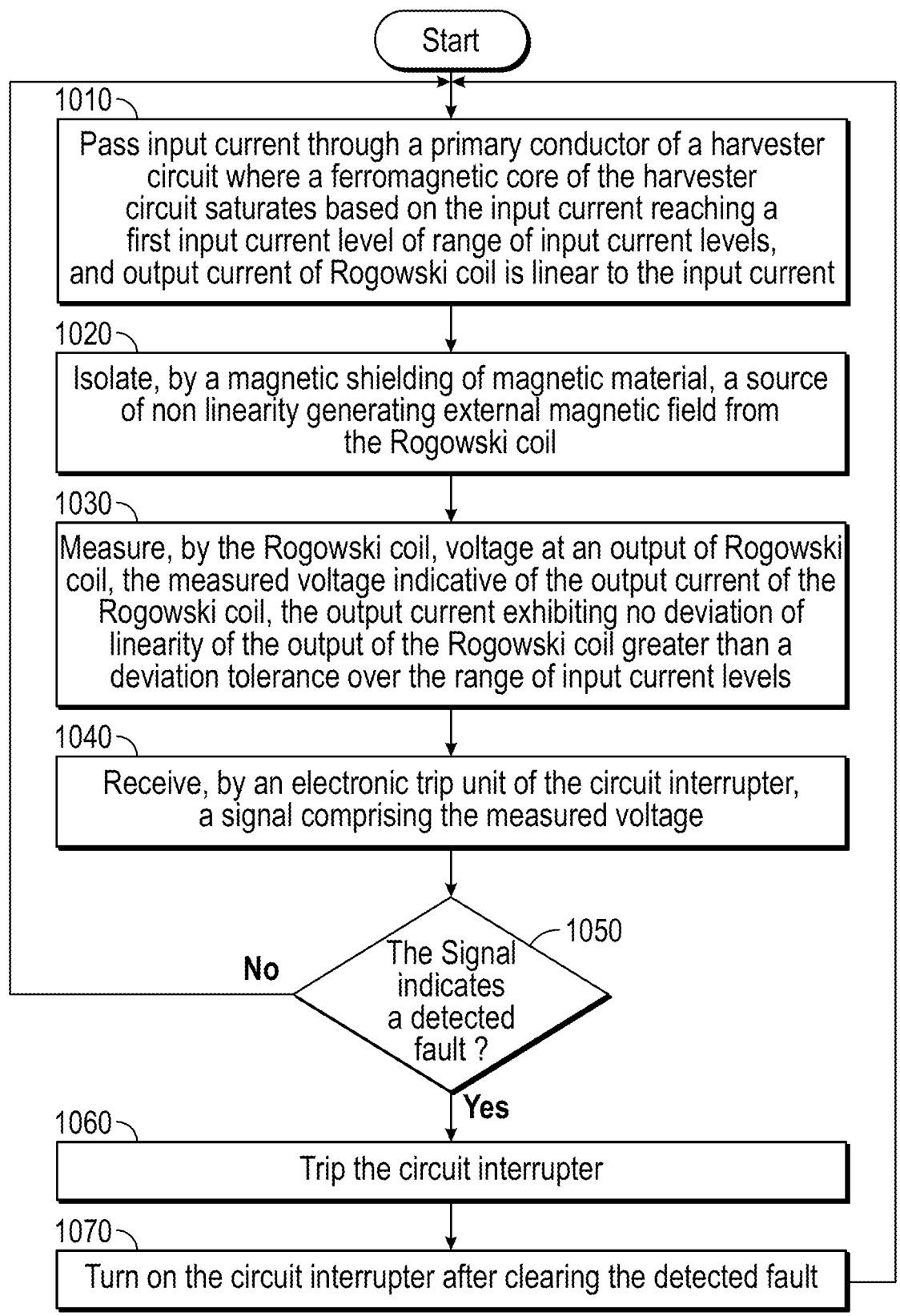
FIG. 10 is a flowchart of a method of improving linearity of current sensors and accuracy of a circuit interrupter in accordance with an example embodiment of the disclosed concept.

FIG. 10 is a flow chart of a method 1000 of improving linearity of a current sensor of a circuit interrupter in accordance with an example embodiment of the disclosed concept. The method 1000 may be performed by the circuit interrupter 10 as described with reference to FIGS. 1 and 5-8B or any components thereof.

At 1010, the circuit interrupter passes input current through a primary conductor of a harvester circuit, where a ferromagnetic core of the harvester circuit saturates based on the input current reaching a first input current level of a range of input current levels, and output current of Rogowski coil is linear to the input current.

At 1020, a magnetic shielding of magnetic material isolates a source of non-linearity generating external magnetic field from the Rogowski coil over a range of input current levels. Isolating the source from Rogowski coil includes generating a return path for magnetic flux of an external magnetic field generated by a source including at least the harvester circuit, a near-by pole-to-pole interaction, or a near-by current carrying components within the circuit interrupter. In some examples, the magnetic the magnetic flux lines of the external magnetic field to travel through the magnetic material to the non-linearity source via the return path. In some examples, the magnetic shielding absorbs the external magnetic field by preventing the magnetic flux lines to return to the non-linearity source via the air around the magnetic shielding. The magnetic material has high permeability, e.g., without limitation, greater than or equal to 10,000. The magnetic material may be mu alloy. In some example, the Rogowski coil includes non-uniform winding, where a first error rate of the Rogowski coil measured with the magnetic shielding present is lower than a second error rate of the Rogowski coil without the magnetic shielding, the first error rate exhibits a sudden change in the error rate over a first range starting from the first input current level, and the second error rate remains constant over the range of input current levels, the sudden change indicative of the deviation of the linearity greater than the deviation tolerance.

At 1030, the Rogowski coil measures voltage at an output of Rogowski coil, the measured voltage indicative of the output current of the Rogowski coil, the output current exhibiting no deviation of linearity of the output of the Rogowski coil greater than a deviation tolerance over the range of input current levels. The deviation tolerance may be, e.g., without limitation, 0.25% where 0%=perfect linearity).

At 1040, an electronic trip unit of the circuit interrupter receives a signal comprising the measured voltage.

At 1050, the electronic trip unit determines whether to the signal indicates a detected default. If yes, the method 1000 proceeds to 1060, and at 1060 the circuit interrupter is tripped, at 1070 the user turns on the circuit interrupter after clearing the detected fault and the method 1000 returns to 1010. If no, the method 1000 returns to 1010.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of disclosed concept which is to be given the full breadth of the claims appended and any and all equivalents thereof.

What is claimed is:

1. A circuit interrupter structured to electrically connect between a power source coupled to a hot conductor and a load, the circuit interrupter comprising:
   (a) separable contacts;
   (b) an operating mechanism coupled to the separable contacts;
   (c) an electronic trip unit coupled to the operating mechanism; and
   (d) a current sensor assembly comprising:
      (i) a harvester circuit comprising a harvester core, a primary conductor through which input current from the power source flows, and a secondary winding wound around a first part of the harvester core, the harvester circuit structured to harvest power from the power source and supply power to at least the operating mechanism and the electronic trip unit, wherein the harvester core saturates at a first input current level of a range of input current levels;
      (ii) a Rogowski coil comprising a toroid through the center of which the primary conductor passes, the Rogowski coil structured to measure voltage at an output of the Rogowski coil, the measured voltage indicative of output current of Rogowski coil, wherein linearity of the output of Rogowski coil to the input current deviates more than a deviation tolerance based at least in part on saturation of the harvester core at the first input current level, and (iii) a compensation coil wound around a second part of the harvester core, the compensation coil structured to delay saturation of the harvester core until the input current reaches a second input current level higher than the first input current level, wherein the electronic trip unit is structured to receive a signal including the measured voltage from the Rogowski coil, and cause the operating mechanism to open the separable contacts and interrupt current flowing through the circuit interrupter based at least in part on the measured voltage.

2. The circuit interrupter of claim 1, wherein the compensation coil is arranged 180 degree opposite to the secondary winding of the harvester circuit.

3. The circuit interrupter of claim 2, wherein in delaying the saturation of the harvester core, the compensation coil is structured to generate magnetic flux in a direction of the harvester core.

4. The circuit interrupter of claim 3, wherein by generating the magnetic flux in the direction of the harvester core, the compensation coil is structured to prevent linking magnetic flux of external magnetic field generated by at least the harvester core to the Rogowski until the second input current level is reached.

5. The circuit interrupter of claim 4, wherein the compensation coil provides a fully automatic compensation for deviation of linearity.

6. The circuit interrupter of claim 5, wherein the fully automatic compensation comprises an automatic measurement of a single calibration factor for correcting an error in the output of the Rogowski coil based at least in part on the saturation of the harvester core at the second input current level.

7. The circuit interrupter of claim 1, the Rogowski coil comprises a plurality of number of turns and two-degree error in winding, each turn being represented as a slit and the two degree error in winding comprising seven slits.

8. The circuit interrupter of claim 7, wherein a first error rate of the Rogowski coil with the compensation coil is lower than a second error rate of the Rogowski coil without the compensation coil, the first error rate exhibits a sudden change in error rate over a first range starting from the first input current level, and the second error rate remains constant over the range of input current levels, the sudden change indicative of the deviation of the linearity greater than the deviation tolerance.

9. The circuit interrupter of claim 1, wherein the deviation tolerance is 0.25% where 0% equal to perfect linearity.

10. A circuit interrupter structured to electrically connect between a power source coupled to a hot conductor and a load coupled to a load conductor, the circuit interrupter comprising:

(a) separable contacts;
(b) an operating mechanism coupled to the separable contacts;
(c) an electronic trip unit coupled to the operating mechanism; and
(d) a current sensor assembly comprising:
  (i) a harvester circuit comprising a harvester core, a primary conductor through which input current from the power source flows, and a secondary winding wound around a first part of the harvester core, the harvester circuit structured to harvest power from the power source and supply power to at least the operating mechanism and the electronic trip unit, wherein the harvester core saturates at a first input current level of a range of input current levels;
  (ii) a Rogowski coil comprising a toroid through the center of which the primary conductor passes, the Rogowski coil structured to measure voltage at an output of the Rogowski coil, the measured voltage indicative of output current of Rogowski coil, wherein linearity of the output of Rogowski coil to the input current deviates more than a deviation tolerance based at least in part on saturation of the harvester core at the first input current level, and
  (iii) a magnetic shielding made of magnetic material having a high permeability, the magnetic shielding arranged between the Rogowski coil and the harvester circuit and structured to isolate the non-linearity source from the Rogowski coil, wherein the electronic trip unit is structured to receive a signal including the measured voltage from the Rogowski coil, and cause the operating mechanism to open the separable contacts and interrupt current flowing through the circuit interrupter based at least in part on the measured voltage.

11. The circuit interrupter of claim 10, wherein the magnetic material comprises has a high relative permeability greater than 10,000.

12. The circuit interrupter of claim 10, wherein to isolate the non-linearity source from the Rogowski coil, the magnetic shielding is structured to generate a return path for magnetic flux of the external magnetic field generated by the non-linearity source.

13. The circuit interrupter of claim 12, wherein the magnetic shielding is further structured to accommodate the magnetic flux lines of the external magnetic field to travel through the magnetic material to the non-linearity source via the return path.

14. The circuit interrupter of claim 12, wherein the magnetic shielding absorbs the external magnetic field by preventing the magnetic flux lines to return to the non-linearity source via the air around the magnetic shielding.

15. The circuit interrupter of claim 10, wherein the magnetic material comprises a mumetal alloy.

16. The circuit interrupter of claim 10, wherein the Rogowski coil comprises non-uniform winding.

17. The circuit interrupter of claim 16, wherein a first error rate of the Rogowski coil measured with the magnetic shielding present is lower than a second error rate of the Rogowski coil without the magnetic shielding, the first error rate exhibits a sudden change in the error rate over a first range starting from the first input current level, and the second error rate remains constant over the range of input current levels, the sudden change indicative of the deviation of the linearity greater than the deviation tolerance.

18. A method of improving linearity of a current sensor and accuracy of a circuit interrupter including a Rogowski coil for sensing load current, a harvester circuit having a ferromagnetic core, a primary conductor, and a secondary winding, and a compensation coil arranged 180 degree opposite to the secondary winding, comprising:

passing input current through the primary conductor, wherein the ferromagnetic core saturates based on input current reaching a first input current level of a range of input current levels, output current of the Rogowski coil being linear to the input current;

delaying, by the compensation coil, saturation of the ferromagnetic core until the input current reaches a second input current level;

measuring, by the Rogowski coil, voltage at an output of Rogowski coil, the measured voltage indicative of the output current of the Rogowski coil, the output current exhibiting no deviation of linearity of the output of the Rogowski coil greater than a deviation tolerance over the range of input current levels;

receiving, by an electronic trip unit of the circuit interrupter, a signal comprising the measured voltage;

determining that the signal indicates a detected fault based on the measured voltage; and in response to determining that the signal indicates the detected fault, tripping the circuit interrupter.

19. The method of claim 18, wherein delaying, by the compensation coil, saturation of the ferromagnetic core comprises:

generating magnetic flux in a direction of the harvester core;

preventing linking magnetic flux of external magnetic field generated by at least the harvester core to the Rogowski until the second input current level is reached; and providing a fully automatic compensation for deviation of linearity, wherein the fully automatic compensation comprises an automatic measurement of a single calibration factor for correcting an error in the output of the Rogowski coil based at least in part on the saturation of the harvester core at the second input current level.

20. The method of claim 19, wherein the fully automatic compensation comprises automatically measuring a single calibration factor for correcting an error in the output of the Rogowski coil based at least in part on the saturation of the harvester core at the second input current level.

* * * * *